United States Patent
Lin

(10) Patent No.: US 9,287,324 B2
(45) Date of Patent: Mar. 15, 2016

(54) NON-VOLATILE MEMORY WITH RESISTIVE ELEMENT AND MANUFACTURING METHOD THEREOF

(71) Applicant: GLYPHTRON CORP., Hsinchu County (TW)

(72) Inventor: Chrong-Jung Lin, Hsinchu (TW)

(73) Assignee: GLYPHTRON CORP., Hsinchu County (TW)

( * ) Notice: Subject to any disclaimer, the term of this patent is extended or adjusted under 35 U.S.C. 154(b) by 0 days.

(21) Appl. No.: 14/504,563

(22) Filed: Oct. 2, 2014

(65) Prior Publication Data

US 2015/0325626 A1     Nov. 12, 2015

(30) Foreign Application Priority Data

May 8, 2014    (TW) .............................. 103116387 A

(51) Int. Cl.
     *H01L 47/00*      (2006.01)
     *H01L 27/24*      (2006.01)
     *H01L 45/00*      (2006.01)

(52) U.S. Cl.
     CPC ........ *H01L 27/2436* (2013.01); *H01L 45/1206* (2013.01); *H01L 45/16* (2013.01)

(58) Field of Classification Search
None
See application file for complete search history.

(56) References Cited

U.S. PATENT DOCUMENTS

| | | | | |
|---|---|---|---|---|
| 8,107,274 | B2 * | 1/2012 | Lin | ........................ H01L 45/145 365/148 |
| 9,209,225 | B2 * | 12/2015 | Lin | ...................... H01L 27/2418 |
| 2008/0224178 | A1 * | 9/2008 | Pacha | ................. G11C 13/0004 257/208 |
| 2011/0026297 | A1 * | 2/2011 | Lin | ........................ H01L 45/145 365/148 |
| 2012/0302034 | A1 * | 11/2012 | Lee | .................... H01L 29/66795 438/400 |
| 2015/0200232 | A1 * | 7/2015 | Lin | ................... H01L 23/53228 257/5 |

* cited by examiner

*Primary Examiner* — Evan Pert
*Assistant Examiner* — Herve Assouman
(74) *Attorney, Agent, or Firm* — WPAT, PC; Justin King

(57) ABSTRACT

A non-volatile memory includes a substrate, a fin structure, a gate structure, a transition layer, and a metal layer. The fin structure is protruded from the substrate. A first source/drain region and a second source/drain region are formed in the fin structure. The gate structure covers a top surface and two lateral surfaces of a part of the fin structure. The gate structure is arranged between the first source/drain region and the second source/drain region. The transition layer is in contact with the second source/drain region. The metal layer is in contact with the transition layer. By setting or resetting the transition layer, a resistance value of the transition layer is correspondingly changed.

21 Claims, 4 Drawing Sheets

NON-VOLATILE MEMORY WITH RESISTIVE ELEMENT AND MANUFACTURING METHOD THEREOF

This application claims the benefit of Taiwan Patent Application No. 103116387, filed May 8, 2014, the subject matter of which is incorporated herein by reference.

FIELD OF THE INVENTION

The present invention relates to a non-volatile memory and a manufacturing method thereof, and more particularly to a non-volatile memory with a resistive element and a manufacturing method thereof.

BACKGROUND OF THE INVENTION

As is well known, a non-volatile memory is able to continuously retain data after the supplied power is interrupted. A flash memory is one of the most popular non-volatile memories. Generally, each cell of the flash memory has a floating gate transistor. The storing status of the floating gate transistor may be determined according to the amount of the stored charges.

Recently, a novel non-volatile memory with a resistive element as the main storage element has been introduced into the market. This non-volatile memory is also referred as a resistive random access memory (RRAM).

FIG. 1 is a schematic cross-sectional view illustrating a conventional non-volatile memory with a resistive element. This non-volatile memory is disclosed in U.S. Pat. No. 8,107,274 for example. As shown in FIG. 1, the non-volatile memory 300 has a (1T+1R) cell. The term "1T" denotes one transistor. The term "1 R" denotes one resistor. That is, the cell of the non-volatile memory 300 comprises a transistor 310 and a resistive element 320. The resistive element 320 is connected to the transistor 310. In addition, the resistive element 320 is a variable and reversible resistive element, and the transistor 310 is a switch transistor. When the transistor 310 is turned on, the resistive element 320 may be programmed or the storing status of the resistive element 320 may be read.

The transistor 310 comprises a substrate 318, a gate dielectric layer 313, a gate electrode 312, a first source/drain region 314, a second source/drain region 316, and a spacer 319. The substrate 318 is a well region.

The resistive element 320 comprises a transition metal oxide layer 110, a dielectric layer 150, and a conductive plug module 130. The dielectric layer 150 is formed on the first source/drain region 314. The conductive plug module 130 is disposed on the transition metal oxide layer 110.

The conductive plug module 130 comprises a metal plug 132 and a barrier layer 134. The metal plug 132 is vertically disposed over the transition metal oxide layer 110, and electrically connected with the transition metal oxide layer 110. The barrier layer 134 is arranged around the metal plug 132. The transition metal oxide layer 110 is formed by reacting a portion of the dielectric layer 150 with the barrier layer 134.

Moreover, for providing different resistance values, the transition metal oxide layer 110 may be selectively set or reset. Each resistance value is correlated with a storing status. Consequently, the transition metal oxide layer 110 may be used to store charges. In other words, the resistive element 320 may be used as a storage element. Generally, the action of setting the resistive element 320 is equivalent to a program action, and the action of resetting the resistive element 320 is equivalent to an erase action.

FIG. 2 is a plot illustrating the resistive characteristics of the transition metal oxide layer of the conventional non-volatile memory with the resistive element. For setting the transition metal oxide layer 110, a set voltage (e.g. about 3V) is provided to the transition metal oxide layer 110, so that the transition metal oxide layer 110 is in a first storing status and has a low resistance value. For resetting the transition metal oxide layer 110, a reset voltage (e.g. about 1V) and a rest current (e.g. 100 µA) are provided to the transition metal oxide layer 110, so that the transition metal oxide layer 110 is in a second storing status and has a high resistance value.

Moreover, during a read cycle, only a small read voltage (e.g. about 0.4V~1V) is provided to the transition metal oxide layer 110. According to the magnitude of the corresponding read current, the storing status of the transition metal oxide layer 110 can be realized. For example, if the read current generated by the transition metal oxide layer 110 is lower than 5 µA during the read cycle, the transition metal oxide layer 110 is in the second storing status (i.e. with a high resistance value). Whereas, if the read current generated by the transition metal oxide layer 110 is higher than 5 µA during the read cycle, the transition metal oxide layer 110 is in the first storing status (i.e. with a low resistance value).

From the above discussions, a higher driving current is required to reset the transition metal oxide layer 110 of the resistive element 320. Due to the higher driving current, the size of the transistor 310 should be increased. However, the larger size of the transistor 310 results in the increase of the area of the cell structure. Under this circumstance, the storage capacity of the cell structure per unit area is reduced.

SUMMARY OF THE INVENTION

An embodiment of the present invention provides a non-volatile memory. The non-volatile memory includes a substrate, a fin structure, a gate structure, a transition layer, and a metal layer. The fin structure is protruded from the substrate. A first source/drain region and a second source/drain region are formed in the fin structure. The gate structure covers a top surface and two lateral surfaces of a part of the fin structure. The gate structure is arranged between the first source/drain region and the second source/drain region. The transition layer is in contact with the second source/drain region. The metal layer is in contact with the transition layer. By setting or resetting the transition layer, a resistance value of the transition layer is correspondingly changed.

Another embodiment of the present invention provides a method for manufacturing a non-volatile memory. Firstly, a substrate is etched, so that a fin structure is protruded from the substrate. Then, a gate structure is formed. A top surface and two lateral surfaces of a part of the fin structure are covered by a gate structure, so that the fin structure is divided into a first zone and a second zone by the gate structure. Then, an ion implantation process is performed, so that a first source/drain region is formed in the first zone and a second source/drain region is formed in the second zone. Then, an insulation layer is formed over the second source/drain region. Then, the insulation layer is etched to form a via in the insulation layer, wherein a bottom of the via is in contact with a surface of the second source/drain region. Then, a dielectric layer is formed on an inner wall and the bottom of the via. Then, a barrier layer is formed on the dielectric layer. Then, a metal layer is filled into the via. Then, the dielectric layer and the barrier layer are reacted with each other to form a transition layer. By setting or resetting the transition layer, a resistance value of the transition layer is correspondingly changed.

A further embodiment of the present invention provides a method for manufacturing a non-volatile memory. Firstly, a substrate is etched, so that a fin structure is protruded from the substrate. Then, a gate structure is formed. A top surface and two lateral surfaces of a part of the fin structure are covered by a gate structure, so that the fin structure is divided into a first zone and a second zone by the gate structure. Then, an ion implantation process is performed, so that a first source/drain region is formed in the first zone and a second source/drain region is formed in the second zone. Then, a dielectric layer and an insulation layer are sequentially formed over the second source/drain region. Then, the insulation layer and the dielectric layer are etched to form a via in the insulation layer and the dielectric layer, wherein a part of the dielectric layer is arranged between a bottom of the via and the second source/drain region. Then, a barrier layer is formed on an inner wall and the bottom of the via. Then, a metal layer is filled into the via. Then, the dielectric layer and the barrier layer are reacted with each other to form a transition layer. By setting or resetting the transition layer, a resistance value of the transition layer is correspondingly changed.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a non-volatile memory with a resistive element and a manufacturing method thereof. In accordance with the present invention, the resistive element is disposed on a fin field-effect transistor (Fin FET). Since the fin field-effect transistor has a small size and a large driving current, the size of the cell structure is reduced and the storage capacity of the cell structure per unit area is increased.

Figure 1:
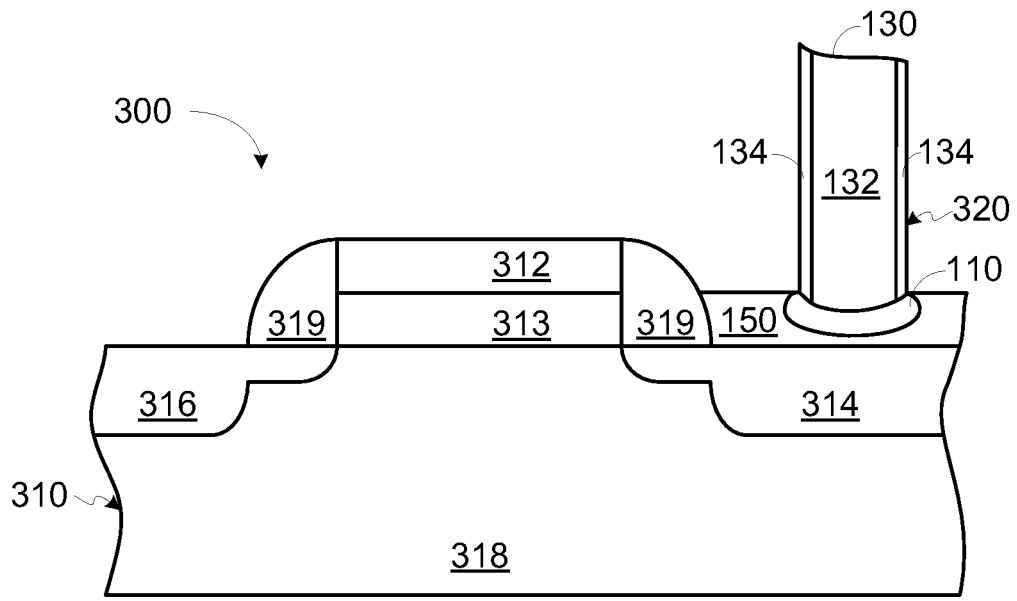
FIG. 1 (prior art) is a schematic cross-sectional view illustrating a conventional non-volatile memory with a resistive element.
Figure 2:
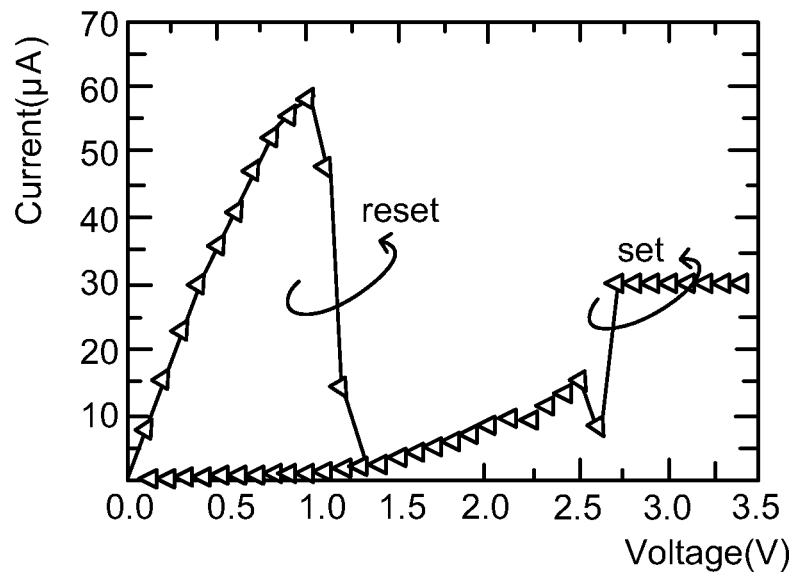
FIG. 2 (prior art) is a plot illustrating the resistive characteristics of the transition metal oxide layer of the conventional non-volatile memory with the resistive element.
Figure 3:
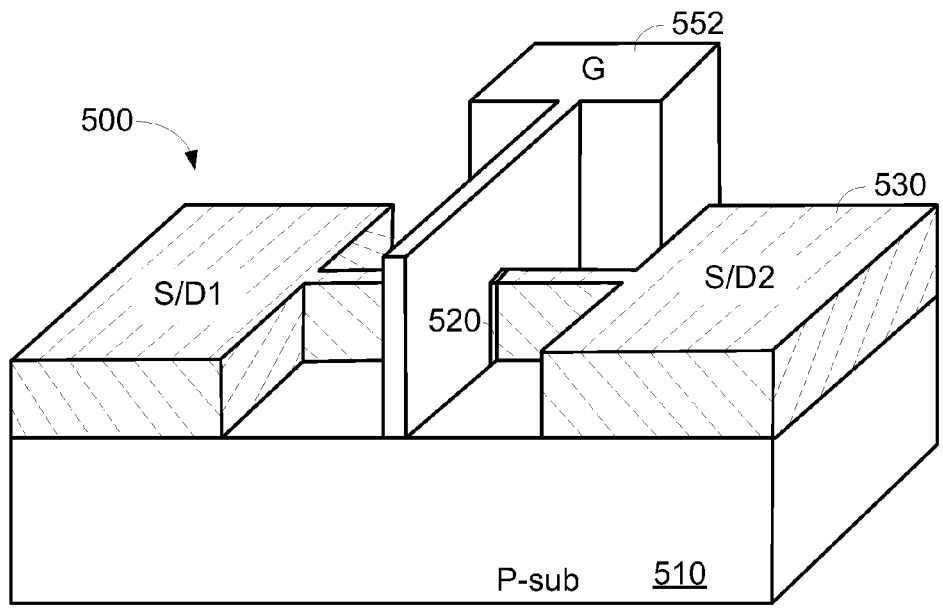
FIG. 3 schematically illustrates a fin field-effect transistor of a non-volatile memory according to an embodiment of the present invention.

FIG. 3 schematically illustrates a fin field-effect transistor of a non-volatile memory according to an embodiment of the present invention. As shown in FIG. 3, the fin field-effect transistor 500 comprises a P-type substrate 510, a fin structure 530 and a gate structure. The fin structure 530 is formed by etching a part of the P-type substrate 510. The fin structure 530 is substantially a protrusion platform, which is protruded from the P-type substrate 510 and indicated as oblique lines. A middle part of the fin structure 530 is covered by the gate structure. By the gate structure, the fin structure 530 is divided into two zones.

As shown in FIG. 3, the gate structure comprises a gate dielectric layer 520 and a gate electrode layer (G) 552. The top surface and the bilateral surfaces of the middle part of the fin structure 530 are covered by the gate dielectric layer 520. The gate dielectric layer 520 is covered by the gate electrode layer 552. Moreover, after an ion implantation process is performed, the portions of the fin structure 530 that are located at two opposite sides of the fin structure 530 and uncovered by the fin structure 530 are doped as two N-type regions. The two N-type regions of the fin field-effect transistor 500 include a first source/drain region (S/D1) and a second source/drain region (S/D2). The gate dielectric layer 520 is a high-K dielectric layer made of HfSiON, $HfO_2$, HfSiO, or $SiO_xN_y$.

Obviously, the top side and the bilateral sides of the channel region are controlled by the gate structure of the fin field-effect transistor 500. Consequently, a higher channel current (or a driving current) is generated, and a leakage current is effectively decreased. The non-volatile memory with the resistive element according to the present invention is designed according to the excellent properties of the fin field-effect transistor 500.

Figure 4A:
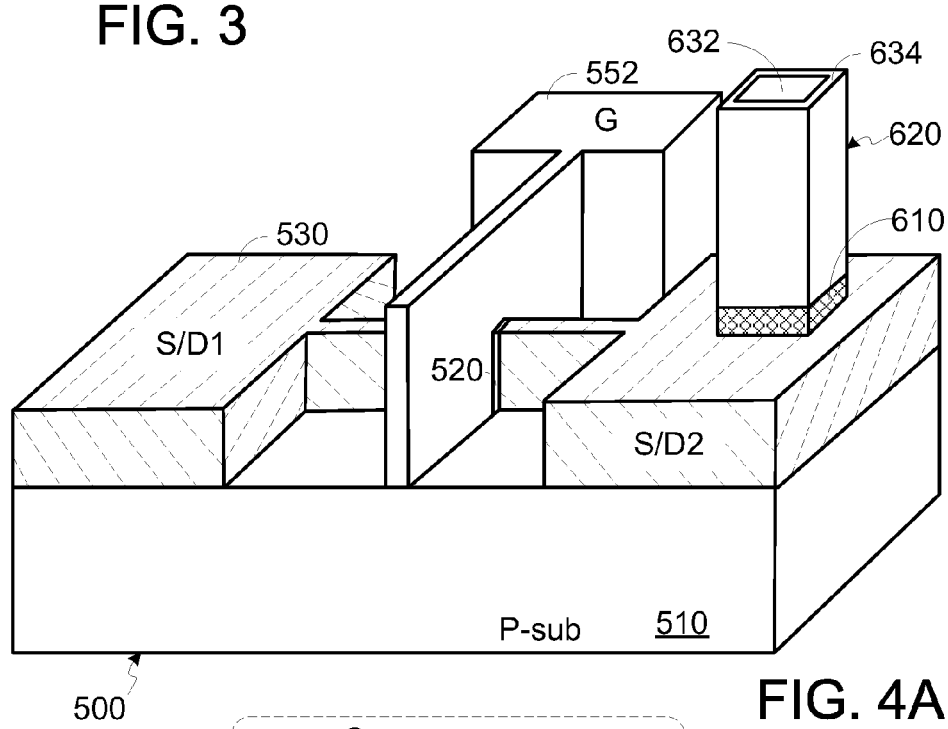
FIG. 4A schematically illustrates the fin field-effect transistor and a resistive element of the non-volatile memory according to the embodiment of the present invention.
Figure 4B:
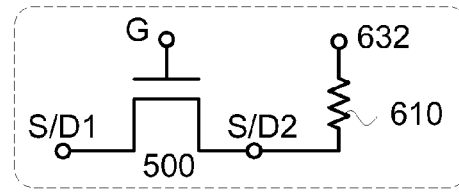
FIG. 4B schematically illustrates an equivalent circuit of the non-volatile memory of FIG. 4A.

FIG. 4A schematically illustrates the fin field-effect transistor and a resistive element of the non-volatile memory according to the embodiment of the present invention. FIG. 4B schematically illustrates an equivalent circuit of the non-volatile memory of FIG. 4A.

The structures of the fin field-effect transistor 500 are similar to those of the fin field-effect transistor of FIG. 3, and are not redundantly described herein. The resistive element 620 comprises a transition layer 610 and a conductive plug module. The transition layer 610 is formed on the second source/drain region (S/D2). The conductive plug module comprises a metal layer 632 and a barrier layer 634. The metal layer 632 is vertically disposed over the transition layer 610, and electrically connected with the transition layer 610. The barrier layer 634 is arranged around the metal layer 632.

As shown in FIG. 4B, the transition layer 610 is connected between the metal layer 632 and the second source/drain region (S/D2) of the fin field-effect transistor 500.

FIGS. 5A-5E schematically illustrate the procedures of a method of manufacturing a non-volatile memory with a resistive element according to a first embodiment of the present invention.

Figure 5A:
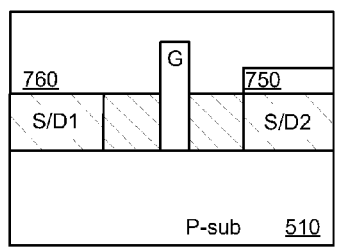
FIGS. 5A~5E schematically illustrate the procedures of a method of manufacturing a non-volatile memory with a resistive element according to a first embodiment of the present invention.

Firstly, as shown in FIG. 5A, a fin field-effect transistor 500 is provided. The structures of the fin field-effect transistor 500 are similar to those of the fin field-effect transistor of FIG. 3, and are not redundantly described herein. Moreover, a dielectric layer 750 is formed on the second source/drain region (S/D2), and an insulation layer 760 is formed over the dielectric layer 750 and the fin field-effect transistor 500.

Figure 5B:
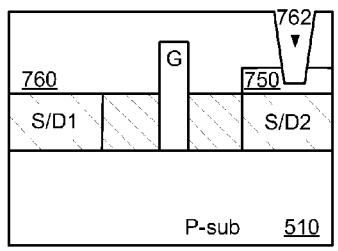

Then, as shown in FIG. 5B, an etching process is performed to partially remove the insulation layer 760 and the dielectric layer 750, so that a via 762 is formed. Moreover, a part of the dielectric layer 750 is arranged between the bottom of the via 762 and the second source/drain region (S/D2).

Figure 5C:
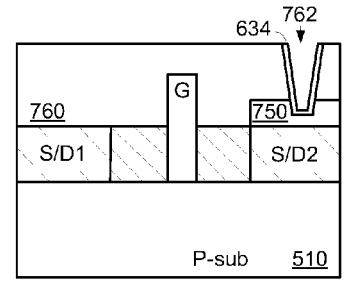

Then, as shown in FIG. 5C, a barrier layer 634 is formed on the inner wall and the bottom of the via 762. Consequently, the part of the barrier layer 634 at the bottom of the via 762 are in contact with each other.

Figure 5D:
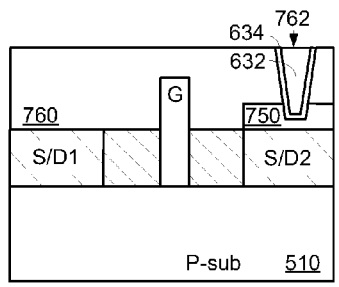
Figure 5E:
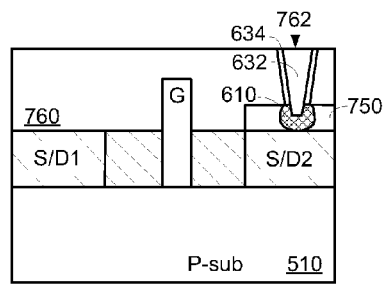

Then, as shown in FIG. 5D, a metal layer 632 is filled into the via 762.

Then, a reaction is carried out at a high temperature. By this reaction, the barrier layer 634 and the dielectric layer 750 are reacted with each other to form a transition layer 610. After the transition layer 610 is formed, the transition layer 610 is connected between the metal layer 632 and the second source/drain region (S/D2) of the fin field-effect transistor 500. Moreover, by setting or resetting the transition layer 610, a resistance value of the transition layer 610 is correspondingly changed.

FIGS. 6A~6E schematically illustrate the procedures of a method of manufacturing a non-volatile memory with a resistive element according to a second embodiment of the present invention.

Figure 6A:
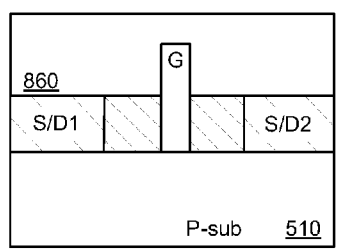
FIGS. 6A~6E schematically illustrate the procedures of a method of manufacturing a non-volatile memory with a resistive element according to a second embodiment of the present invention.

Firstly, as shown in FIG. 6A, a fin field-effect transistor 500 is provided. The structures of the fin field-effect transistor 500 are similar to those of the fin field-effect transistor of FIG. 3, and are not redundantly described herein. Moreover, an insulation layer 860 is formed over the fin field-effect transistor 500.

Figure 6B:
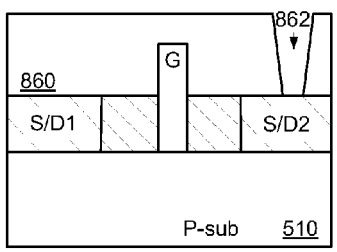

Then, as shown in FIG. 6B, an etching process is performed to partially remove the insulation layer 860, so that a via 862 is formed. Meanwhile, the bottom of the via 862 is in contact with the surface of the second source/drain region (S/D2) of the field-effect transistor 500.

Figure 6C:
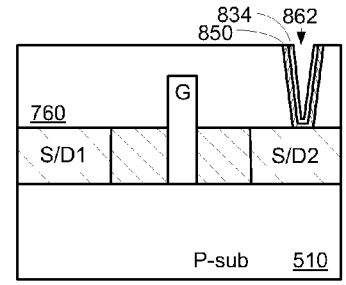

Then, as shown in FIG. 6C, a dielectric layer 850 and a barrier layer 834 are sequentially formed on the inner wall and the bottom of the via 862. That is, in the via 862, the dielectric layer 850 is covered by the barrier layer 834.

Figure 6D:
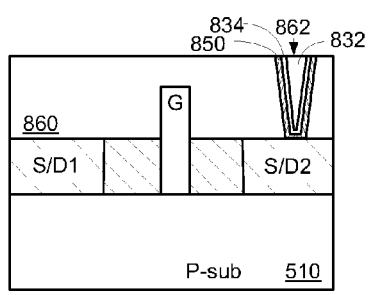
Figure 6E:
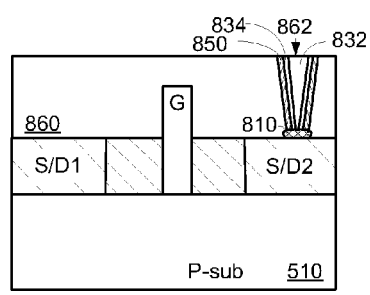

Then, as shown in FIG. 6D, a metal layer 832 is filled into the via 862.

Then, a reaction is carried out at a high temperature. By this reaction, the barrier layer 834 and the dielectric layer 850 are reacted with each other to form a transition layer 810. After the transition layer 810 is formed, the transition layer 810 is connected between the metal layer 832 and the second source/drain region (S/D2) of the fin field-effect transistor 500. Moreover, by setting or resetting the transition layer 810, a resistance value of the transition layer 810 is correspondingly changed.

In the above embodiments, each of the dielectric layers 750 and 850 is made of silicon dioxide ($SiO_2$). Moreover, each of the barrier layers 634 and 834 is made of Hf, HfOx, HfOxNy, Mg, MgOx, MgOxNy, NiOx, NiOxNy, TaOxNy, Ta, TaOx, TaNx, TiOxNy, Ti, TiOx or TiNx. Moreover, each of the transition layers 610 and 810 is made of HfOx, HfOxNy, MgOx, MgOxNy, NiOx, NiOxNy, TaOxNy, TaOx, TaNx, TiOxNy, TiOx or TiNx. Among these materials, HfOx, MgOx, NiOx, TaOx and TiOx are transition metal oxides, TaNx and TiNx are transition metal nitrides, and HfOxNy, MgOxNy, NiOxNy, TaOxNy and TiOxNy are transition metal nitrogen oxide dielectric materials. Moreover, each of the metal layers 632 and 832 is made of copper, aluminum or tungsten.

From the above descriptions, the present invention provides a non-volatile memory with a resistive element and a manufacturing method thereof. In accordance with the present invention, the resistive element is disposed on a fin field-effect transistor (Fin FET). Since the fin field-effect transistor has a small size and a large driving current, the size of the cell structure is reduced, and the storage capacity of the cell structure per unit area is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
   a substrate;
   a fin structure protruded from the substrate, wherein a first source/drain region and a second source/drain region are formed in the fin structure;
   a gate structure covering a top surface and two lateral surfaces of a part of the fin structure, wherein the gate structure is arranged between the first source/drain region and the second source/drain region;
   a transition layer in contact with the second source/drain region; and
   a metal layer in contact with the transition layer,
   wherein, an insulation layer is formed on a first part of the second source/drain region; a second part of the second source/drain region is exposed through a via in the insulation layer; a dielectric layer is formed on an inner wall and a bottom of the via; a barrier layer is formed on the dielectric layer; the metal layer is filled in the via; the dielectric layer and the barrier layer are reacted with each other to form the transition layer; and the transition layer is in contact with the second source/drain region and the metal layer; and
   wherein by setting or resetting the transition layer, a resistance value of the transition layer is correspondingly changed.

2. The non-volatile memory as claimed in claim 1, wherein the gate structure comprises:
   a gate dielectric layer covering the top surface and the two lateral surfaces of the part of the fin structure; and
   a gate electrode layer covering the gate dielectric layer.

3. The non-volatile memory as claimed in claim 2, wherein the gate dielectric layer is a high-K dielectric layer made of HfSiON, $HfO_2$, HfSiO, or $SiO_xN_y$.

4. The non-volatile memory as claimed in claim 1, wherein the dielectric layer is made of silicon dioxide.

5. The non-volatile memory as claimed in claim 4, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

6. The non-volatile memory as claimed in claim 5, wherein the transition layer is made of HfOx, HfOxNy, MgOx, MgOxNy, NiOx, NiOxNy, TaOxNy, TaOx, TaNx, TiOxNy, TiOx or TiNx.

7. The non-volatile memory as claimed in claim 6, wherein the metal layer is made of copper, aluminum or tungsten.

8. A method for manufacturing a non-volatile memory, the method comprising steps of:
   (a) etching a substrate, so that a fin structure is protruded from the substrate;
   (b) forming a gate structure, wherein a top surface and two lateral surfaces of a part of the fin structure are covered by a gate structure, so that the fin structure is divided into a first zone and a second zone by the gate structure;

(c) performing an ion implantation process, so that a first source/drain region is formed in the first zone and a second source/drain region is formed in the second zone;
(d) forming an insulation layer over the second source/drain region;
(e) etching the insulation layer to form a via in the insulation layer, wherein a bottom of the via is in contact with a surface of the second source/drain region;
(f) forming a dielectric layer on an inner wall and the bottom of the via;
(g) forming a barrier layer on the dielectric layer;
(h) filling a metal layer into the via; and
(i) allowing the dielectric layer and the barrier layer to be reacted with each other to form a transition layer,
wherein by setting or resetting the transition layer, a resistance value of the transition layer is correspondingly changed.

9. The method as claimed in claim 8, wherein the dielectric layer is made of silicon dioxide.

10. The method as claimed in claim 9, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

11. The method as claimed in claim 10, wherein the transition layer is made of HfOx, HfOxNy, MgOx, MgOxNy, NiOx, NiOxNy, TaOxNy, TaOx, TaNx, TiOxNy, TiOx or TiNx.

12. The method as claimed in claim 11, wherein the metal layer is made of copper, aluminum or tungsten.

13. The method as claimed in claim 8, wherein the step of forming the gate structure comprises sub-steps of:
forming a gate dielectric layer to cover the top surface and the two lateral surfaces of the part of the fin structure; and
forming a gate electrode layer to cover the gate dielectric layer.

14. The method as claimed in claim 1, wherein the gate dielectric layer is a high-K dielectric layer made of HfSiON, $HfO_2$, HfSiO, or $SiO_xN_y$.

15. A method for manufacturing a non-volatile memory, the method comprising steps of:
(a) etching a substrate, so that a fin structure is protruded from the substrate;
(b) forming a gate structure, wherein a top surface and two lateral surfaces of a part of the fin structure are covered by a gate structure, so that the fin structure is divided into a first zone and a second zone by the gate structure;
(c) performing an ion implantation process, so that a first source/drain region is formed in the first zone and a second source/drain region is formed in the second zone;
(d) sequentially forming a dielectric layer and an insulation layer over the second source/drain region;
(e) etching the insulation layer and the dielectric layer to form a via in the insulation layer and the dielectric layer, wherein a part of the dielectric layer is arranged between a bottom of the via and the second source/drain region;
(f) forming a barrier layer on an inner wall and the bottom of the via;
(g) filling a metal layer into the via; and
(h) allowing the dielectric layer and the barrier layer to be reacted with each other to form a transition layer,
wherein by setting or resetting the transition layer, a resistance value of the transition layer is correspondingly changed.

16. The method as claimed in claim 15, wherein the dielectric layer is made of silicon dioxide.

17. The method as claimed in claim 16, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

18. The method as claimed in claim 17, wherein the transition layer is made of HfOx, HfOxNy, MgOx, MgOxNy, NiOx, NiOxNy, TaOxNy, TaOx, TaNx, TiOxNy, TiOx or TiNx.

19. The method as claimed in claim 18, wherein the metal layer is made of copper, aluminum or tungsten.

20. The method as claimed in claim 15, wherein the step of forming the gate structure comprises sub-steps of:
forming a gate dielectric layer to cover the top surface and the two lateral surfaces of the part of the fin structure; and
forming a gate electrode layer to cover the gate dielectric layer.

21. The method as claimed in claim 20, wherein the gate dielectric layer is a high-K dielectric layer made of HfSiON, $HfO_2$, HfSiO, or $SiO_xN_y$.

* * * * *